(12) United States Patent
Janssens

(10) Patent No.: US 11,494,315 B1
(45) Date of Patent: Nov. 8, 2022

(54) SIGNAL ARBITER

(71) Applicant: Dialog Semiconductor B.V., 's-Hertogenbosch (NL)

(72) Inventor: Paulus Augustinus Joanna Janssens, 's-Hertogenbosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 17/235,414

(22) Filed: Apr. 20, 2021

(51) Int. Cl.
*G06F 13/16* (2006.01)
*H03K 19/20* (2006.01)
*G06F 9/448* (2018.01)
*H03K 19/00* (2006.01)

(52) U.S. Cl.
CPC ........ *G06F 13/1621* (2013.01); *G06F 9/4498* (2018.02); *G06F 13/1668* (2013.01); *H03K 19/0002* (2013.01); *H03K 19/20* (2013.01)

(58) Field of Classification Search
CPC .......... H03K 19/0002; H03K 19/20; G06F 13/1621; G06F 13/1668; G06F 13/364; G06F 13/362; G06F 9/4498
See application file for complete search history.

(56) References Cited

U.S. PATENT DOCUMENTS 5,713,025 A * 1/1998 Molnar ................. G06F 9/3824
712/E9.046

OTHER PUBLICATIONS

"Multi-resource Approach to Asynchronous SoC: Design and Tool Support," by Stanislavs Golubcovs, PhD Thesis, Dec. 2011, University of Newcastle upon Tyne, School of Electrical, Electronic and Computer Engineering, 153 pages.
"Variation Tolerant Design of Arbiters and Synchronizers," by Mohammed Saleh Abdullah Alshaikh, PhD Thesis, Jan. 2014, University of Newcastle upon Tyne, School of Electrical, Electronic and Computer Engineering, 168 pages.

* cited by examiner

*Primary Examiner* — Jany Richardson
(74) *Attorney, Agent, or Firm* — Saile Ackerman LLC; Stephen B. Ackerman

(57) ABSTRACT

An arbiter for use with a plurality of request signals is presented. The arbiter includes a sequence identifier to identify an order between the plurality of request signals. The arbiter provides a plurality of output signals in which each output signal is associated with a request signal. When the request signals are provided in a sequential order the output signals are provided in the identified sequential order. When the request signals are provided substantially at the same time the output signals are provided in an arbitrary sequential order. A corresponding signal arbitration method and an electronic circuit comprising the arbiter are also presented.

21 Claims, 13 Drawing Sheets

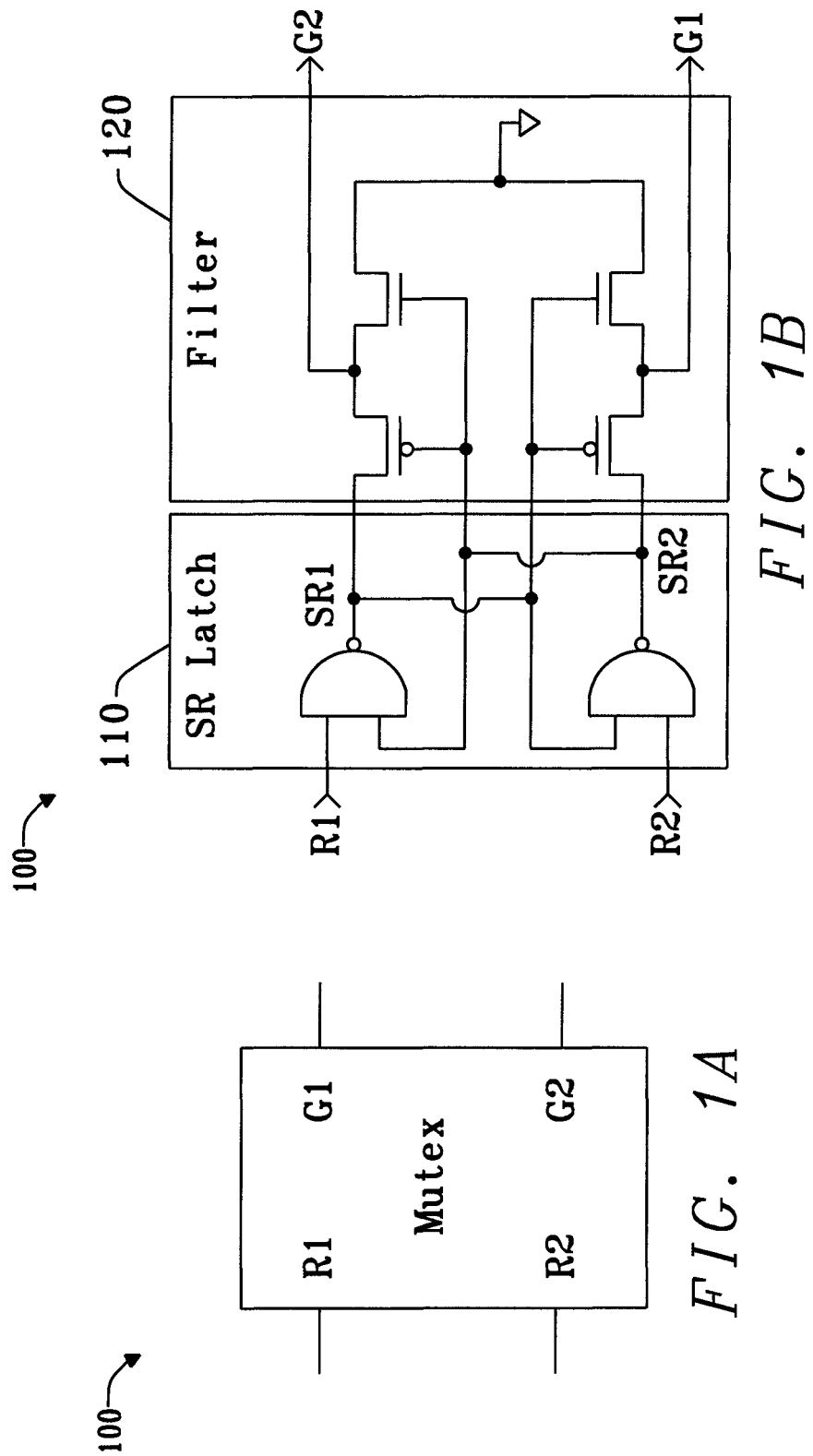

SIGNAL ARBITER

FIELD OF THE DISCLOSURE

The present disclosure relates to an arbiter circuit and a corresponding signal arbitration method. In particular the present disclosure relates to an asynchronous arbiter.

BACKGROUND

When an electronic device needs access to a particular resource, for instance a shared memory, that device may send a request signal to the shared memory to access it. If the resource needs to be accessed by multiple devices, then multiple requests need to be handled. In this case an arbiter may be used.

In other situations electronic circuits, for instance asynchronous circuits, may use several request signals to perform a specific operation. If multiple request signals are received at the same time or within a very short time, for instance a few picoseconds or femtoseconds, then the circuit may enter a metastable state that prevents normal operation. An arbiter is then used to select which request signal should be provided or served to the circuit first. The request grants should be mutually exclusive, that is the next request should be served only once the previous request has been handled.

Mesh arbiter circuits designed by interleaving multiple 2-input MUTEX elements in a mesh-like structure have been reported in section 3.6.1 of the Thesis titled "Multi-resource Approach to Asynchronous SoC: Design and Tool Support" by Stanislays Golubcovs, University of Newcastle upon Tyne, School of Electrical, Electronic and Computer Engineering, December 2011.

Such arbiter circuits are limited in that in operation they often need to reject a request signal and/or do not consistently grant the request signals in their original order.

Ordered arbiters designed to preserve the order of incoming pending requests have been proposed (See section 3.6.4 of the above Thesis by Stanislays Golubcovs). Such arbiters which implement a windowing function are limited in that for three requests, the $2^{nd}$ and $3^{rd}$ requests might be swapped if they occur at or around the same time with the 1st request.

A low-latency ordered arbiter has been described in section 2.4.3.6 of Thesis titled "Variation Tolerant Design of Arbiters and Synchronizers" by Mohammed Saleh Abdullah Alshaikh, University of Newcastle upon Tyne, School of Electrical, Electronic and Computer Engineering, January 2014. The arbiter described in this Thesis is designed to keep the original order of the incoming request with a relatively low latency that is function of multiple AND gates. However, in some situations this low-latency ordered arbiter may lead to a deadlock, hence stopping the circuit. This can occur when three request arrive at the same time or close to each other.

It is an object of the disclosure to address one or more of the above mentioned limitations.

SUMMARY OF THE DISCLOSURE

According to a first aspect of the disclosure, there is provided an arbiter for use with a plurality of request signals, the arbiter comprising a sequence identifier adapted to identify an order between the plurality of request signals; the arbiter being adapted to provide a plurality of output signals each output signal being associated with a request signal, wherein when the request signals are provided in a sequential order the output signals are provided in the identified sequential order, and when the request signals are provided substantially at the same time the output signals are provided in an arbitrary sequential order.

Optionally, the arbiter comprises an input stage to receive the plurality of request signals, wherein the input stage comprises a plurality of filter cells to filter the plurality of request signals.

For example, the input stage may be adapted to receive three or more request signals, for instance asynchronous requests.

Optionally, the sequence identifier comprises a plurality of memory cells, each memory cell being adapted to receive two input logic signals and hold one of the signals high and the other low based on their order of arrival.

Optionally, the plurality of memory cells comprise a plurality of mutual exclusion (MUTEX) cells. For instance, each memory cell may be provided by a MUTEX cell.

Optionally, each memory cell is coupled to two different filter cells to receive two different filtered request signals.

Optionally, the sequence identifier comprises a logic circuit coupled to the memory cells to identify the sequential order.

Optionally, the logic circuit comprises a plurality of AND gates, each AND gate being coupled to the outputs of at least two memory cells for receiving logic signals associated with a same request.

Optionally, the arbiter further comprises a forbidden state circuit adapted to identify the occurrence of a forbidden state, and upon identification to arbitrarily select a pending request signal to provide a corresponding output signal. The corresponding output signal may be mutually exclusive.

Optionally, the forbidden state circuit is adapted to disable momentarily at least one request signal upon identifying the occurrence of the forbidden state.

Optionally, the forbidden state may be a state in which several request signals arrive at substantially the same time. For instance for three request signals all request signals arrive at substantially the same time. For four request signals three or four request signals may arrive at substantially the same time. More generally considering N request signals (with N≥3), a forbidden state may be a state in which if N=3 the 3 request signals arrive at substantially the same time and if N is greater than 3, N or N−1 request signals may arrive at substantially the same time.

Optionally, the forbidden state circuit includes a first feedback loop comprising a plurality of OR gates coupled to a timing circuit, the timing circuit being adapted to prevent a false detection of a forbidden state.

Optionally, each OR gate is coupled to a corresponding memory cell of the sequence identifier, and wherein the output of the timing circuit is coupled to the input stage.

Optionally, the timing circuit comprises a NAND gate having a first input coupled to a first path, and a second input coupled to a second path, wherein the first path comprises a NOR gate adapted to receive the output signals, and wherein the second path comprises an AND gate adapted to receive the outputs of the OR gates and the inverted output signals.

For instance, the first path may be a fast path and the second path a slow path, in which the first path may have a shorter delay than the second path.

Optionally, the arbiter further comprises a second feedback loop adapted to prevent an overlap between one or more output signals.

Optionally, the second feedback loop comprises a plurality of NOR gates, each NOR gate being coupled to the logic circuit of the sequence identifier.

Optionally, each filter cell is adapted to receive a dedicated lock signal to lock the filter cell for a required duration.

Optionally, the input stage comprises an AND gate coupled to the output of a filter cell.

According to a second aspect of the disclosure, there is provided a signal arbitration method comprising the steps of receiving a plurality of request signals; identifying an order between the plurality of request signals using a sequence identifier; providing a plurality of output signals each output signal being associated with a request signal, wherein when the request signals are provided in a sequential order the output signals are provided in the identified sequential order, and when the request signals are provided substantially at the same time the output signals are provided in an arbitrary sequential order.

The second aspect may share features of the first aspect, as noted above and herein.

According to a third aspect of the disclosure, there is provided an electronic circuit comprising an arbiter, wherein the arbiter comprises a sequence identifier adapted to identify an order between the plurality of request signals; the arbiter being adapted to provide a plurality of output signals each output signal being associated with a request signal, wherein when the request signals are provided in a sequential order the output signals are provided in the identified sequential order, and when the request signals are provided substantially at the same time the output signals are provided in an arbitrary sequential order.

Optionally, the electronic circuit comprises an arbiter controller, the arbiter controller being adapted to generate a plurality of lock signals, each lock signal being associated with a corresponding filter cell of the arbiter.

Optionally, the electronic circuit comprises a switching converter coupled to the arbiter, the switching converter being adapted to generate a plurality of request signals.

For instance, the switching converter may be a single input multiple output (SIMO) converter, such as SIMO Buck converter.

The electronic circuit may form a power management circuit or system.

The electronic circuit according to the third aspect of the disclosure may comprise any of the features described above in relation to the arbiter according to the first aspect of the disclosure.

BRIEF DESCRIPTION OF THE DRAWINGS

The disclosure is described in further detail below by way of example and with reference to the accompanying drawings, in which:

FIG. 1A is a diagram of a Mutual Exclusion MUTEX cell;
FIG. 1B is a circuit diagram of a MUTEX cell.

DETAILED DESCRIPTION

Figure 1C:
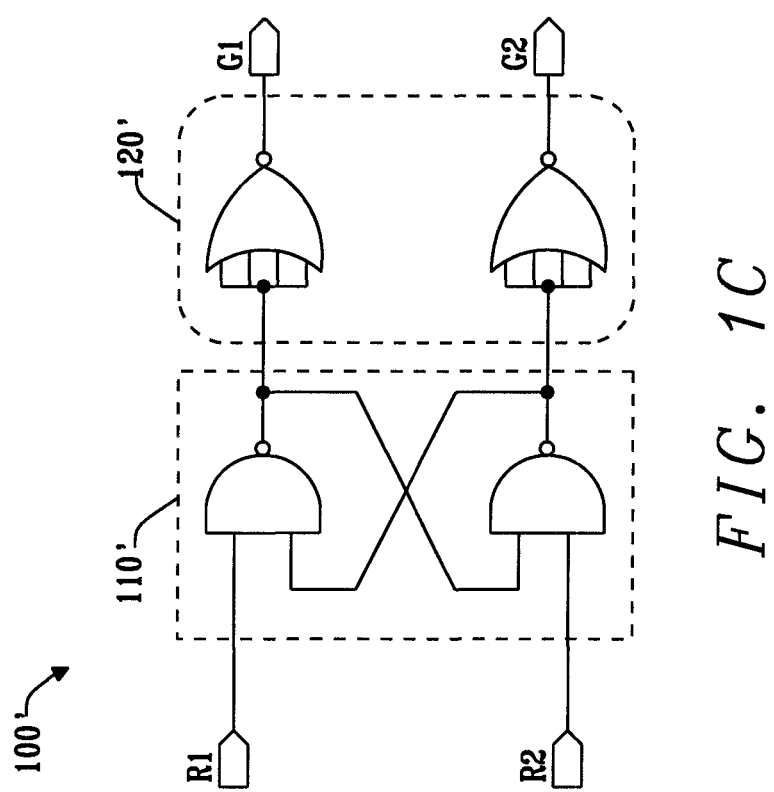
FIG. 1C is another circuit diagram of a MUTEX cell.

FIG. 1A illustrates a Mutual Exclusion (MUTEX) cell or element. Various implementations of the MUTEX cell can be envisaged as described in the Phd Thesis titled "Multi-resource Approach to Asynchronous SoC: Design and Tool Support" by Stanislays Golubcovs, University of Newcastle upon Tyne, School of Electrical, Electronic and Computer Engineering, December 2011. The MUTEX cell also referred to as MUTEX element is presented in section 3.4.1 pages 32 and 33 of the Thesis.

The operation of MUTEX cells is also described in section 2.4.1 of Phd Thesis titled "Variation Tolerant Design of Arbiters and Synchronizers" by Mohammed Saleh Abdullah Alshaikh, University of Newcastle upon Tyne, School of Electrical, Electronic and Computer Engineering, January 2014.

FIG. 1B shows a mutual exclusion circuit for implementing the MUTEX cell of FIG. 1A. In this example the MUTEX cell 100 is formed of a set-reset latch circuit 110 coupled to a filter circuit 120 also referred to as metastability filter. The MUTEX cell has two inputs for receiving the request signals R1 and R2 and two outputs for providing signals G1 and G2.

In operation, the rising edge of the logic signals R1 and R2 may occur at different times. If R1 rises before R2, then the output signal G1 goes high (for instance logic 1) and G2 is held low (logic 0). Conversely, if R2 rises before R1, then the output signal G2 goes high (for instance logic 1) and G1 is held low (logic 0).

If R1 and R2 rise at the same time, then the MUTEX cell selects either G1 or G2. Stated another way, only one of G1 and G2 goes high, while the remaining signal is held low.

As a result a MUTEX cell can be used to prevent a circuit to be trapped in a state that is neither a stable 0 nor a stable 1, also referred to as metastable state. A metastable state can lead to the circuit behaving in an unpredictable way and potentially to system failure.

FIG. 1C shows another mutual exclusion circuit for implementing the MUTEX cell of FIG. 1A. In this case the MUTEX cell 100' includes a set-reset latch circuit (cross-coupled NAND gates) 110' followed by low-threshold inverters 120'.

Figures 2A, 2B:
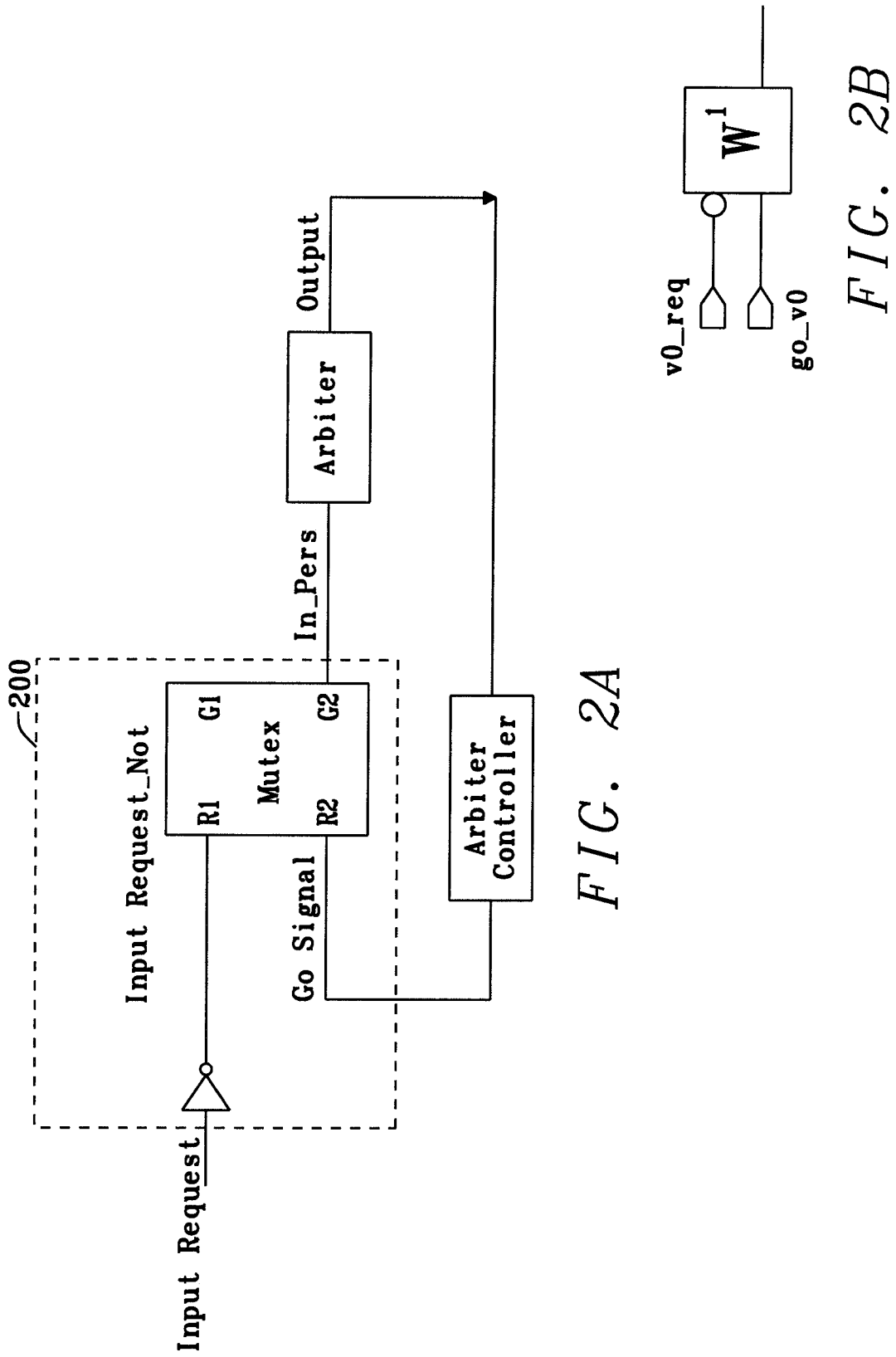
FIG. 2A is a circuit diagram of a filter cell.
FIG. 2B is an equivalent representation of the filter cell of FIG. 2A.

FIG. 2A illustrates a filter cell for filtering glitches on an input signal, coupled to an arbiter. In this example the filter cell is formed of a MUTEX cell as shown in FIG. 1A, and an inverter provided at the first input for receiving an input request. The second input is coupled to the output via a feedback loop that includes cloud of logic. In this example the feedback loop includes an arbiter and an arbiter controller. The filter cell is adapted to receive a logic signal referred to as lock signal or Go signal from the arbiter controller to lock the filter cell for a required duration. When the filter cell is in a locked state only one output can propagate. For instance if the cell is locked in a G1 state, the output at G1 keeps propagating while no output is provided at G2. Conversely if the cell is locked in a G2 state, the output at G2 keeps propagating while no output is provided at G1.

FIG. 2B shows an equivalent representation of the filter cell 200 of FIG. 2A for use with an arbiter circuit portion not shown.

Figure 2C:
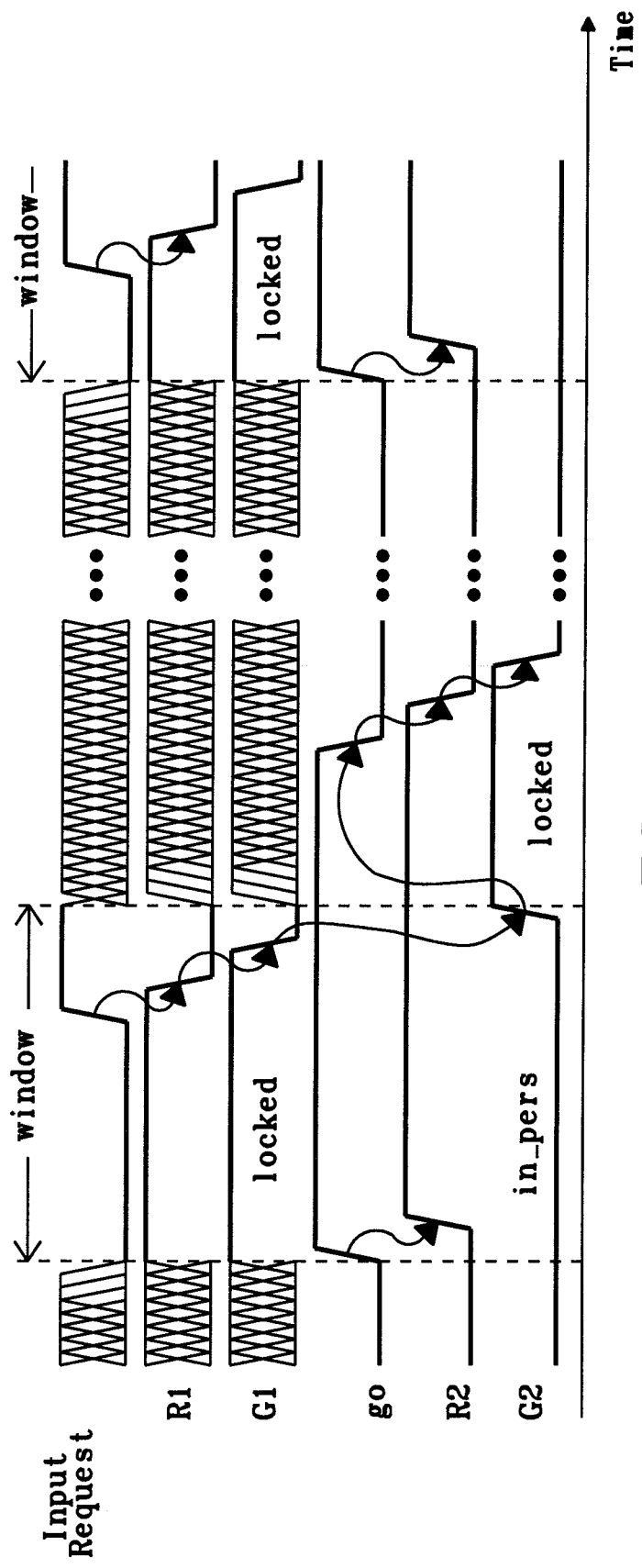
FIG. 2C is a signal diagram illustrating the operation of the filter cell of FIG. 2A.

FIG. 2C is a timing diagram showing the logic signals involved in the operation of the filter cell of FIG. 2A. An input signal (input request) is received by the inverter. A time window defined by the rising edge of the Go signal and the rising edge of the In-pers signal is used for identifying an edge on a glitchy input request signal. Outside of this window, the state of the input request signal is ignored. When the Go signal is set to 1, the MUTEX cell checks for the level (either high or low) of the input request signal. The rising edge of the input request signal then unlocks the MUTEX cell. The Input request_not signal at R1 goes low (0) and the In-pers signal at G2 goes high (1) and remains high until the Go signal goes low. For completeness, it is noted that in a situation in which the input request signal is set high before the rising edge of the Go signal, then the In_pers signal would directly be set high.

Figure 3:
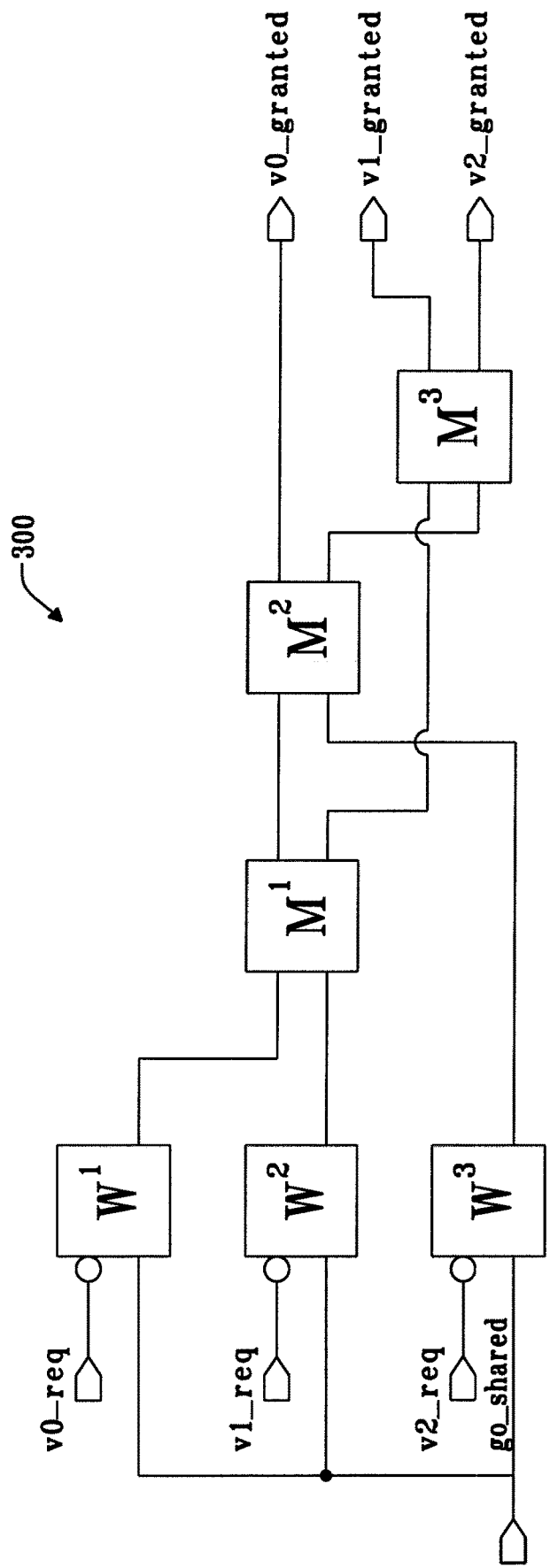
FIG. 3 is a diagram of a mesh arbiter circuit.

FIG. 3 shows a diagram of a mesh arbiter circuit 300. The arbiter 300 includes three filter cells labelled $W^1$, $W^2$, $W^3$ and three MUTEX cells $M^1$, $M^2$ and $M^3$. Each filter cell has a first input for receiving a request signal, a second input for receiving a common go_shared signal, and one output. An inverter is provided at the first input to invert the request signal. Each MUTEX cell has a pair of inputs (first input at the top and second input at the bottom) and a pair of outputs (first output at the top and second output at the bottom). The MUTEX cell $M^1$ receives the output of $W^1$ at its first input and the output of $W^2$ at its second input. The cell $M^2$ receives the first output of $M^1$ (corresponding to the v0 channel) at its first input and the output of $W^3$ (v2 channel) at its second input. The cell $M^3$ receives the second output of $M^1$ (corresponding to the v1 channel) at its first input and the second output of $M^2$ (corresponding to the v2 channel) at its second input.

In operation, the filter cells $W^1$, $W^2$, $W^3$ are used to filter glitches on the request signals v0_req, v1_req and v2_req, respectively. The filter cells remain set until the go_shared signal is lowered. When the go_shared signal goes low, for instance from logic 1 to logic 0, the cell $W^1$ is cleared and the output of $W^1$ goes low. Conversely when the go_shared signal goes high, the output of $W^1$ is v0_req. The same occurs for $W^2$ and $W^3$. The go_shared signal is cleared after a channel is serviced and is used to trigger a new decision round.

The MUTEX cells $M^1$, $M^2$ and $M^3$ are used to deal with metastability and mutual exclusivity of the granted signals. For instance if the two inputs provided to $M^1$ both rise at the same time, the MUTEX cell will randomly select one of the two inputs to ripple through towards the output. If an output was already set due to its corresponding input, the other output will be held low.

Figure 4:
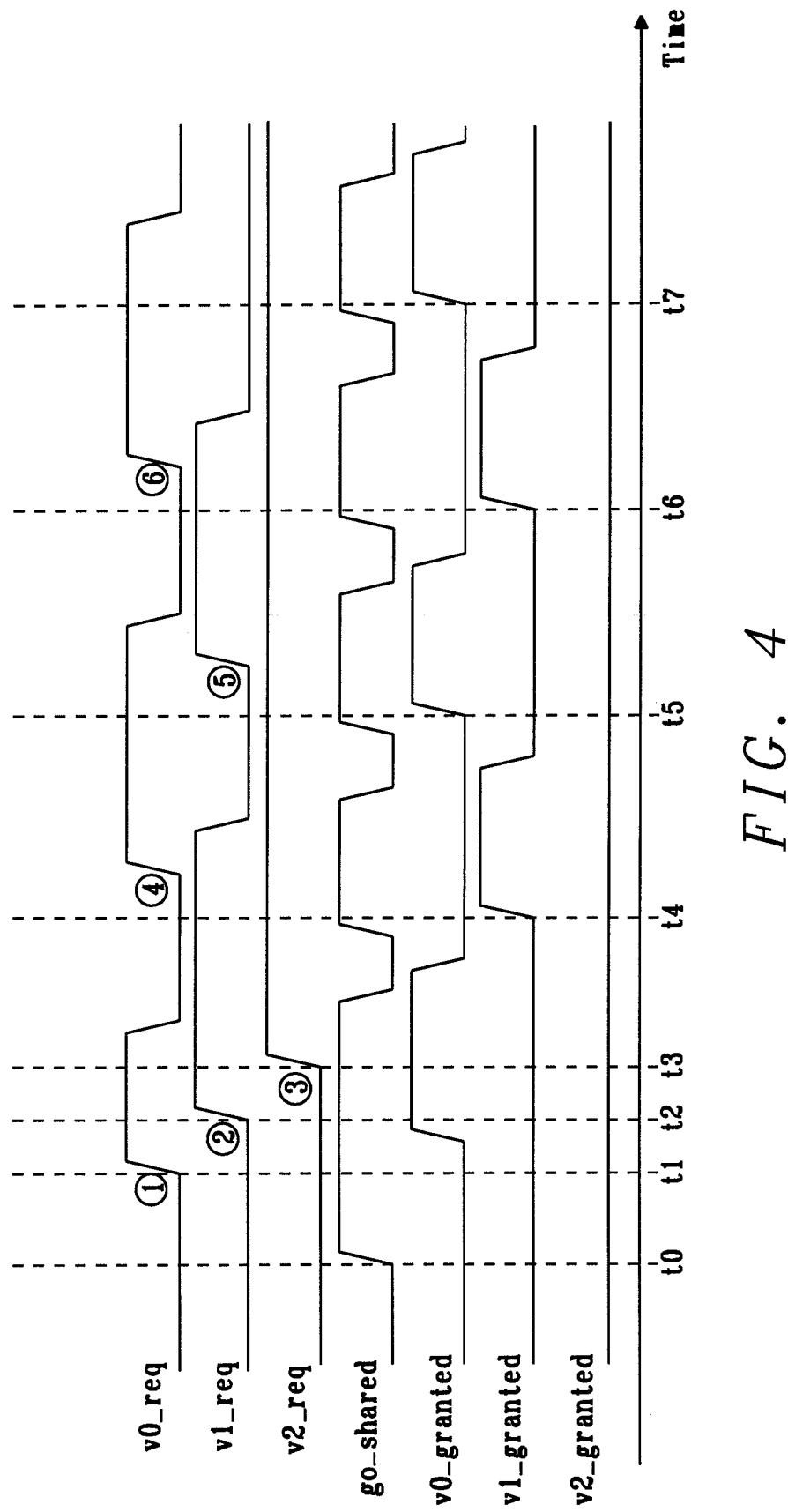
FIG. 4 is a timing diagram illustrating an example operation of the mesh arbiter of FIG. 3.

FIG. 4 is a timing diagram illustrating an example operation of the arbiter 300. The request signals are provided in a specific order v0, v1, v2, v0, v1, v0 as illustrated by the labels 1-6, respectively. In this instance the request v0_req, v1_req and v2_req go from low to high at time t1, t2 and t3, respectively. The go_shared signal goes high at a time t0 prior to t1. The first signal being served is the signal v0_granted which goes high between the times t1 and t2. The go_shared signal is then cleared (1 to 0 and back to 1) and at time t4 the signal v1_granted goes high. Then the next signal being served is the signal v0_granted at time t5, followed by the signal v1_granted at time t6.

In this example, the signal v2_req is never addressed because v0_req and v1_req demand too much bandwidth. In case more than one request is active, the arbiter will select randomly any of the pending requests. This might be an unfair decision due to internal delays that are depending on operating conditions or because the MUTEX cell is not properly balanced.

Figure 5:
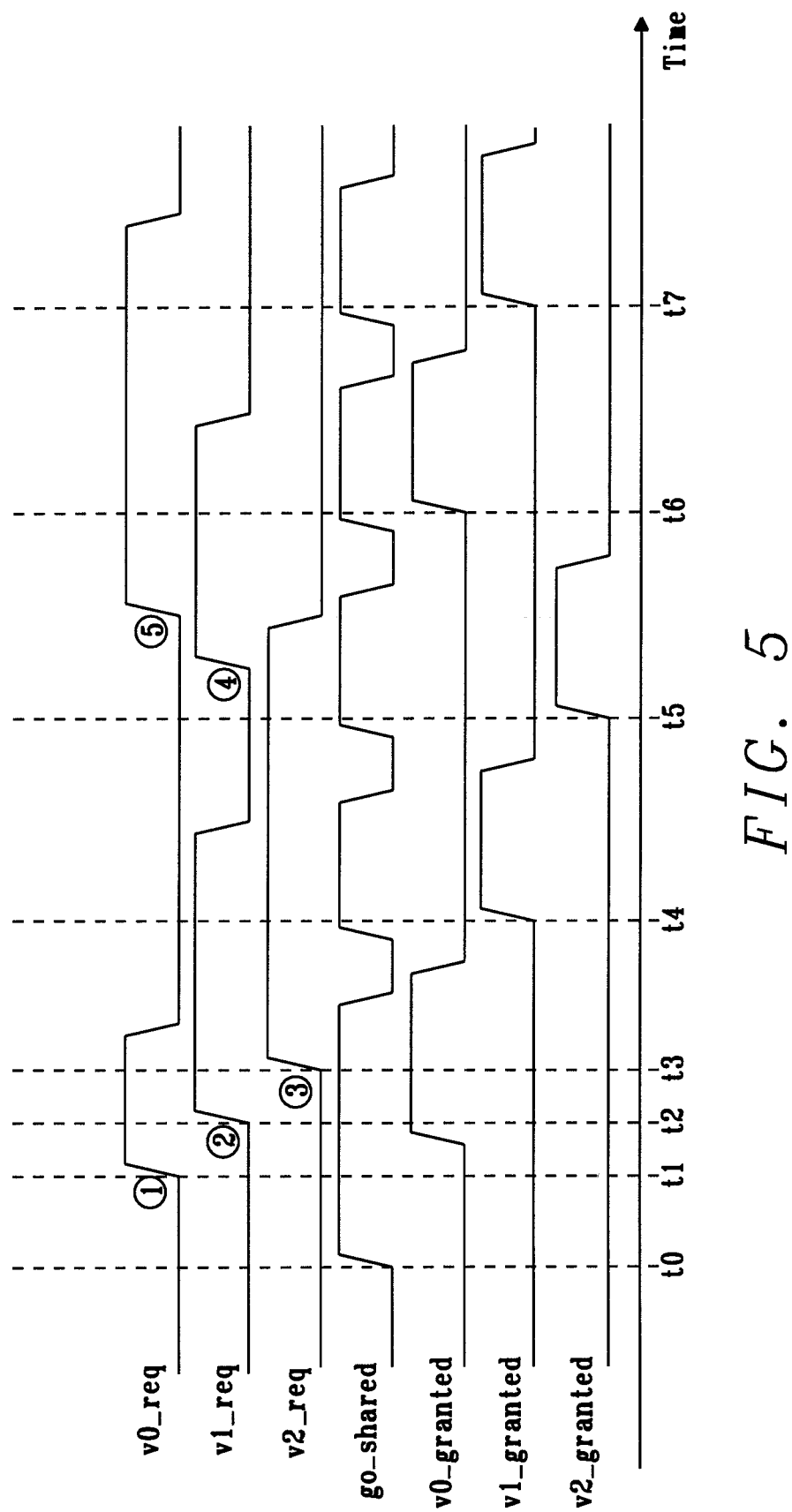
FIG. 5 is a timing diagram illustrating another example operation of the mesh arbiter of FIG. 3.

FIG. 5 is a timing diagram illustrating another example operation of the arbiter 300. The request signals are provided in a specific order v0, v1, v2, v1, v0 as illustrated by the labels 1-5. The first signal being served is the signal v0_granted which goes high between the times t1 and t2, followed by the signal v1_granted at time t4, the signal v2_granted at time t5, then signal v0_granted at time t6 and the signal v1_granted at time t7. Therefore, in this example v2_req is addressed but the order of the 4th and 5th requests is not maintained.

Figure 6:
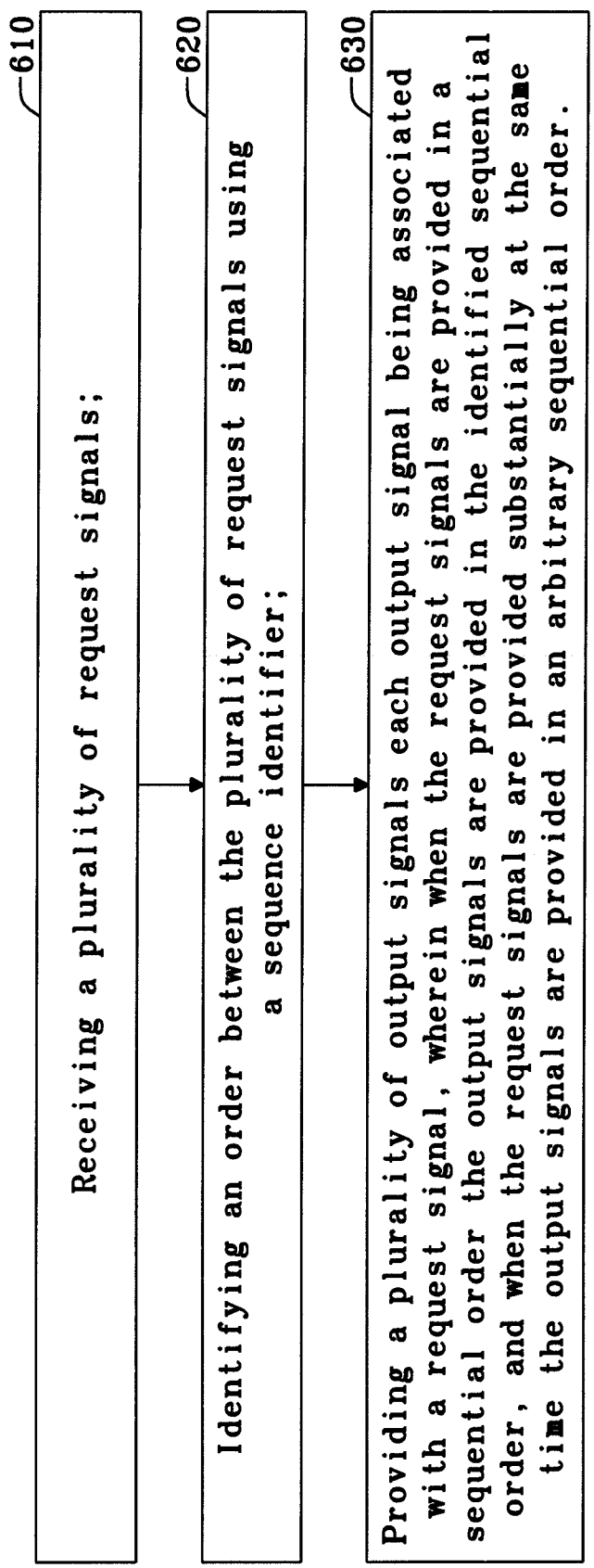
FIG. 6 is a flow chart of a signal arbitration method according to the disclosure.

FIG. 6 is a flow chart of a signal arbitration method according to the disclosure. At step 610, a plurality of request signals are received. At step 620 an order between the plurality of request signals is identified using a sequence identifier. At step 630 a plurality of output signals are provided. Each output signal is associated with a request signal. When the request signals are provided in a sequential order the output signals are provided in the identified sequential order. When the request signals are provided substantially at the same time the output signals are provided in an arbitrary sequential order.

Figure 7:
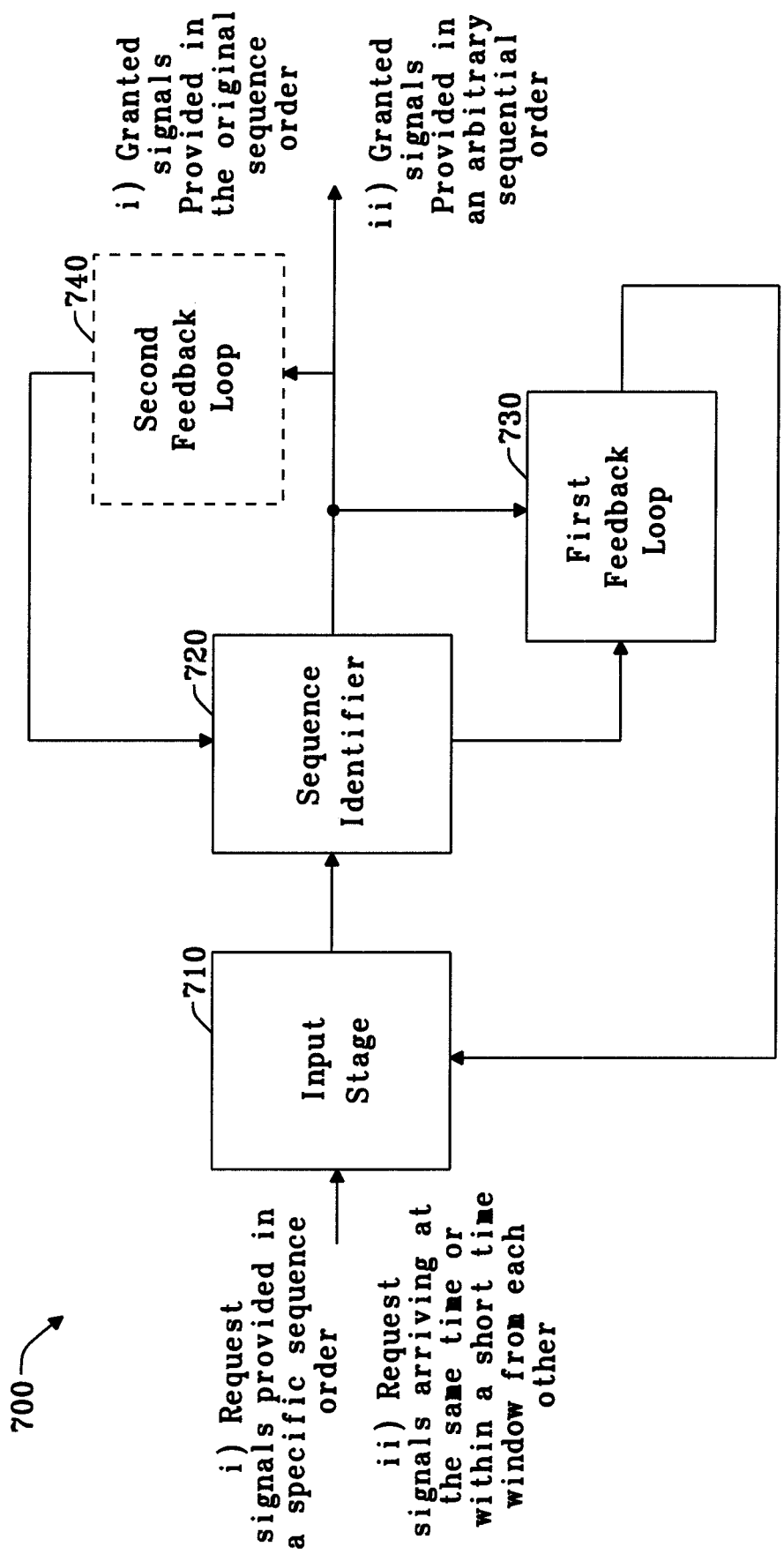
FIG. 7 is a schematic diagram of an arbiter for implementing the method of FIG. 6.

FIG. 7 shows a schematic diagram of an arbiter according to the disclosure. The arbiter 700 includes an input stage 710, a sequence identifier 720, a first feedback loop 730, and a second feedback loop 740.

The input stage 710 is adapted to receive a plurality of request signals in a sequential order. The request signals are digital signals each one having a specific rise time and on-time duration, however two or more signal could rise at the same time or within a short time window.

Several request signals may be considered to arrive at substantially the same time if they arrive within a time window of less than a threshold value. The threshold value may vary depending on the type of logic circuit being used. Typically, the threshold value may be less than about 1 nanosecond. The request signals are filtered and passed to the sequence identifier 720. The sequence identifier 720 is adapted to identify the sequential order of the request signals, and to provide a plurality of output signals. Each output signal is associated with a given request signal and may be referred to as a granted signal. The output or granted signals are provided in the same sequential order previously identified.

The first feedback loop 730 also referred to as forbidden state circuit, is adapted to disable at least one request signal upon identifying the occurrence of a forbidden state also referred to as a stuck state. The forbidden state may be a state in which several request signals arrive at substantially the same time. For instance for three request signals all request signals arrive at substantially the same time. For four request signals three or four request signals may arrive at substantially the same time. More generally considering N request signals (with N≥3), a forbidden state may be a state in which if N=3 the 3 request signals arrive at substantially the same time and if N is greater than 3, N or N−1 request signals may arrive at substantially the same time. For instance, a forbidden state may be a state in which all the request signals arrive at substantially the same time and no output signal is provided by the arbiter. A probability of occurrence of a stuck state is relatively small, however the first feedback loop permits to avoid the arbiter being trapped in such a state.

The forbidden state circuit 730 may be implemented in various fashions and not necessarily as a feedback loop. For instance, a forbidden state circuit may be used in series with the sequence identifier.

The second feedback loop 740, also referred to as second feedback stage, is adapted to prevent an overlap between one or more output signals. The second feedback loop is optional.

The asynchronous arbiter 700 permits to ensure that all requests get serviced equally and in the original order.

Figure 8:
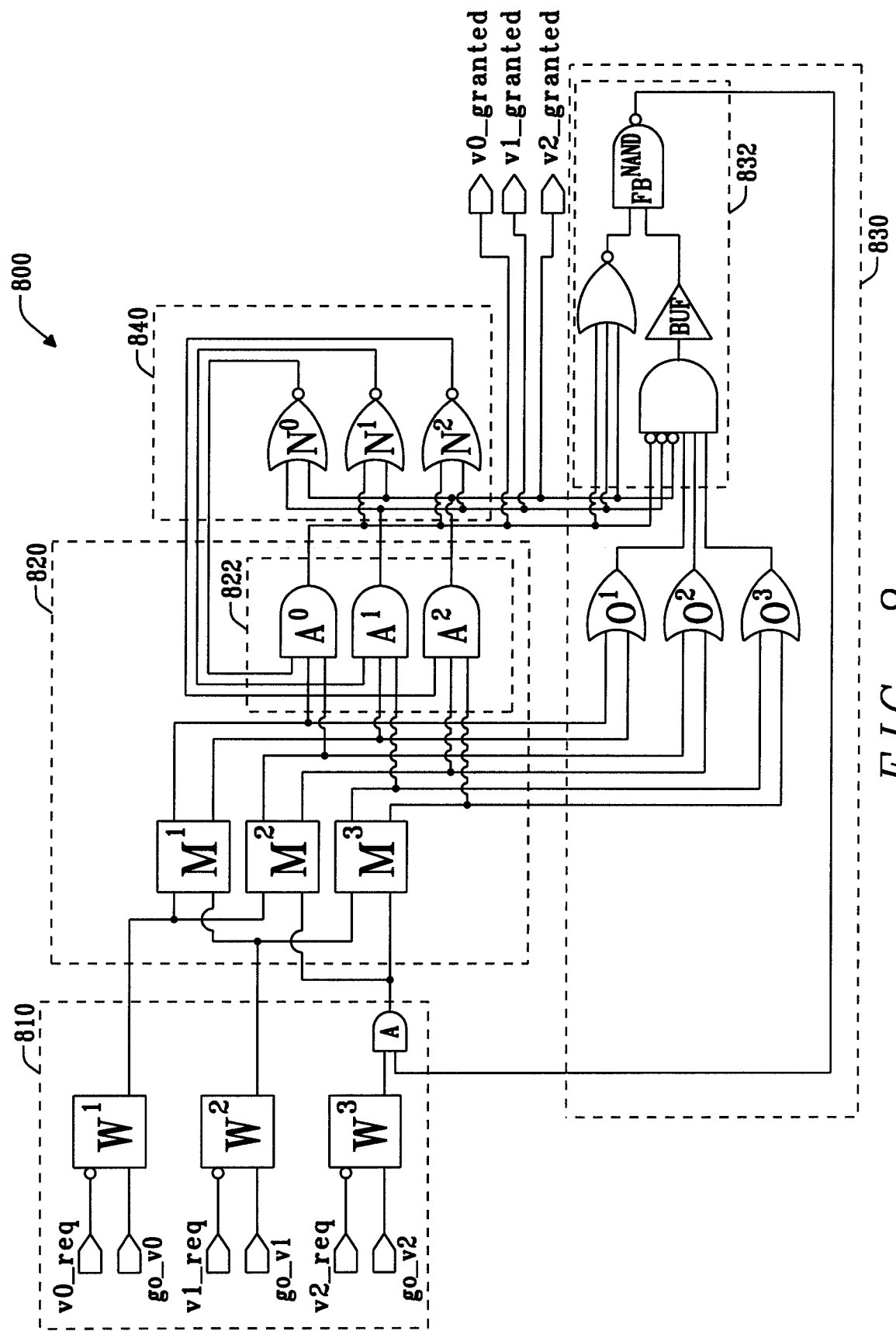
FIG. 8 is an exemplary implementation of the arbiter of FIG. 7.

FIG. 8 illustrates an exemplary implementation of the arbiter of FIG. 7. The arbiter 800 has an input stage 810, a sequence identifier 820, a first feedback loop 830, and a second feedback loop 840.

The input stage 810 includes three filter cells, labelled $W^1$, $W^2$ and $W^3$ for filtering the request signals. In this example the filter cells $W^1$, $W^2$ and $W^3$ may be implemented as described in FIGS. 2A and 2B above. Each filter cell is adapted to receive a different go signal and a different request signal. The go signals come from a separate asynchronous circuit, such as an arbiter controller. A logic gate such as an AND gate A is provided at the output of the third filter cell $W^3$. The AND gate has a first input to receive the output of $W^3$ and a second input to receive the output of the first feedback loop 830. The output of each filter cell is coupled to the sequence identifier 820.

The sequence identifier 820 includes three memory cells. Each memory cell is adapted to receive two input logic signals and hold one of the signals high and the other low based on their order of arrival. In this example the memory cells are implemented using the MUTEX cells $M^1$, $M^2$, and $M^3$. Each MUTEX cell has a pair of inputs (first input at the top and second input at the bottom) and a pair of outputs (first output at the top and second output at the bottom). For instance, the MUTEX cells may be implemented as described in FIG. 1. The cell $M^1$ has a first input coupled to the output of $W^1$ and a second input coupled to the output $W^2$. The cell $M^2$ has a first input coupled to the output of $W^1$ and a second input coupled to the output of the AND gate A. The cell $M^3$ has a first input coupled to the output of $W^2$ and a second input coupled to the output of the AND gate A. The outputs of the MUTEX cells $M^1$, $M^2$, and $M^3$ are coupled to the logic circuit 822 and to the first feedback loop 830. The first output of $M^1$ corresponds to a v0 channel, the second output of $M^1$ corresponds to a v1 channel. The first output of $M^2$ corresponds to a v0 channel, the second output of $M^2$ corresponds to a v2 channel. The first output of $M^3$ corresponds to a v1 channel, the second output of $M^3$ corresponds to a v2 channel.

These MUTEX cells $M^1$, $M^2$, and $M^3$ are therefore provided in a parallel arrangement in which every possible combination between two channels is captured: $M^1$ identifies and stores the order between v0 and v1, $M^2$ identifies and stores the order between v0 and v2, $M^3$ identifies and stores the order between v1 and v2. The order between request signals is updated when a request is translated into a grant signal. For instance, with reference to $M^1$, the v0_granted signal (output of $A^0$) goes high at time t2. The corresponding go_v0 signal can only go low after t2. When g0_v0 goes low the output of $W^1$ is also lowered and the relative order between v0 and v1 is lost. The MUTEX cells $M^1$, $M^2$ and $M^3$ operate in parallel to identify and store the order of the request signals.

The logic circuit 822 includes three AND gates $A^0$, $A^1$, and $A^2$. Each AND gate is associated with a specific channel. In this example $A^0$, $A^1$, $A^2$ are 3-inputs AND gates associated with the channels v0, v1 and v2 respectively. The AND gate $A^0$ has a first input to receive a first feedback signal from the second feedback loop 840, a second input to receive the first output of $M^1$ and a third input to receive the first output of $M^2$. The AND gate $A^1$ has a first input to receive a second feedback signal of the second feedback loop 840, a second input to receive the second output of $M^1$ and a third input to receive the first output of $M^3$. The AND gate $A^2$ has a first input to receive a third feedback signal of the second feedback loop 850, a second input to receive the second output of $M^2$ and a third input to receive the second output of $M^3$. The outputs of the logic circuit 822 are coupled to the first feedback loop 830, to the second feedback loop 840 and to the output of the arbiter for providing the granted signals v0_granted, v1_granted, and v2_granted.

The first feedback loop 830 includes three OR gates $O^1$, $O^2$ and $O^3$ coupled to a timing circuit 832. The OR gate $O^1$ has a first input to receive the first output of $M^1$ and a second input to receive the second output of $M^1$. Similarly, the OR gate $O^2$ has a first input to receive the first output of $M^2$ and a second input to receive the second output of $M^2$. The OR gate $O^3$ has a first input to receive the first output of $M^3$ and a second input to receive the second output of $M^3$.

The timing circuit 832 includes a NAND gate having a first input coupled to a first path, and a second input coupled to a second path. The first path also referred to as fast path extends from the output of the MUTEX cells to the first input of the NAND gate and comprises the AND gates 822 and a NOR gate adapted to receive the output signals v0_granted, v1_granted and v2_granted. The second path also referred to as slow path extends from the output of the MUTEX cells to the second input of the NAND gate and comprises the OR gates $O^1$, $O^2$, $O^3$ and a 6-inputs AND gate adapted to receive the outputs of the OR gates and the inverted output signals. Taking into account the logic gates present in each path and the wiring connecting the logic gates together, the first path introduces a shorter delay than the second path.

The AND gate has six inputs. The three inverters are provided at the first, second and third inputs respectively coupled to the output of the first, second and third AND gates $A^0$, $A^1$, $A^2$. The remaining three inputs are coupled to the outputs of the OR gates $O^1$, $O^2$ and $O^3$.

The NOR gate has three inputs to receive the output of the first, second and third AND gates $A^0$, $A^1$, $A^2$ respectively. The NAND gate has a first input coupled to the output of the NOR gate and a second input coupled to the output of the AND gate via a buffer. The output of the NAND gate is coupled to the AND gate A of the input stage 810.

The second feedback loop 840 includes three NOR gates $N^0$, $N^1$, $N^2$ to provide the first, second and third feedback signals. The NOR gate No has a first input coupled to the output of $A^1$ and a second input coupled to the output of $A^2$. The NOR gate $N^1$ has a first input coupled to the output of $A^0$ and a second input coupled to the output of $A^2$. The NOR gate $N^2$ has a first input coupled to the output of $A^0$ and a second input coupled to the output of $A^1$.

In operation, the input stage 810 is used to filter glitches on the request signals v0_req, v1_req and v2_req, respectively. In contrast with the circuit of FIG. 3, each filter cell receives its own go signal. This permits to keep memory the exact order of the request signals as only the filter cell of the channel that has just been granted is cleared. For instance, the filter cell $W^1$ remains set until the g0_v0 signal is lowered. In the prior art of FIG. 3 all filter cells would be cleared hence losing the original order of the request signals.

The filtered request signals v0_req, v1_req and v2_req are then passed to the sequence identifier 820 to identify the sequence of the request signals. The MUTEX cell $M^1$ is used to identify if the request signal v0_req is before or after v1_req. If v0_req rises before v1_req, then the first output signal goes high (for instance logic 1) and the second output signal is held low (logic 0). On the contrary if v1_req rises before v0_req rises, then the second output signal goes high and the first output signal is held low. If v0_req and v1_req rise at substantially the same time, then the MUTEX cell selects either v0_req and v1_req. Similarly $M^2$ is used to identify if the request signal v0_req is before or after v2_req. The MUTEX cell $M^3$ is used to identify if the request signal v1_req is before or after v2_req. The MUTEX cells then store the exact order of requests. The outputs of the MUTEX cells $M^1$, $M^2$ and $M^3$ are then passed to the logic circuit 822 and to the first feedback loop 830.

The logic circuit 822 is configured to determine whether any request signal arrived first, compared to all others. For instance, v0_req can only be first if it was before v1_req and v2_req. The two MUTEX cells that have those combinations should have chosen in favour of v0_req. In this example this is achieved using AND gates, however other implementations could be envisaged. The AND gates $A^0$, $A^1$, $A^2$ of the logic circuit 822 provide a high output only if all the inputs signals are high. The output of $A^0$ is high when the first output of $M^1$, the first output of $M^2$ and the output of $N^0$ are all high (for instance logic 1). This can only happen when v0_req is before v1_req and before v2_req. The output of $A^1$ is high when the second output of $M^1$, the first output of $M^3$ and the output of $N^1$ are all high. This can only happen when v1_req is before v0_req and before v2_req. Similarly, the output of $A^2$ is high when the second output of $M^2$, the second output of $M^3$ and the output of $N^2$ are all high. This can only happen when v2_req is before v0_req and before v1_req.

The AND gates $A^0$, $A^1$, $A^2$ provide the output signals v0_granted, v1_granted and v2_granted. These output signals are provided to the timing circuit 832 of the first feedback loop 830, the second feedback loop 840, and the output of the arbiter.

The first feedback loop 830 is designed to prevent the arbiter being trapped in a forbidden or stuck state. If the three requests occur at the same time, there is a possibility that all MUTEX cells choose to serve a different signal, leading to a form of uncertainty. In this scenario the arbiter ends up in a so-called stuck state. Considering the example of 3-inputs there are two possible stuck states as follows:

i) $M^1$ serves v0, $M^2$ serves v2 and $M^3$ serves v1.
ii) $M^1$ serves v1, $M^2$ serves v0 and $M^3$ picks v2.

In case of additional inputs the number of stuck states grows exponentially.

The three OR gates $O^1$, $O^2$, $O^3$ detect the situation that all MUTEX cells decided. The OR gates $O^1$, $O^2$, $O^3$ provide a high output (logic 1) if at least one input is high. Therefore, when $M^1$ serves v0 or v1 the output of $O^1$ is 1; when $M^2$ serves v0 or v2 the output of $O^2$ is 1 and when $M^3$ serves v1 or v2 the output of $O^3$ is 1.

A stuck state occurs if all MUTEX cells made a decision and none of the output signals v0_granted, v1_granted and v2_granted are set, that is only if these signals are held low (logic 0).

To identify the occurrence of a potential stuck state, the outputs of the OR gates are combined into the 6-input AND gate together with the three outputs signals of the arbiter. The six-inputs AND gate receives two sets of signals.

The first set includes the outputs of $O^1$, $O^2$, $O^3$. The second set includes the inverted signals v0_granted, v1_granted and v2_granted.

The 3-input NOR gate receives the signals v0_granted, v1_granted and v2_granted. The NOR gate and the 6-inputs AND gate both indicate if no request signal was granted. The difference is that the timing path through the NOR gate should be much faster than the timing path through the 6-inputs AND gate. Only if both inputs (first and second paths) of the NAND gate are true (logic 1), a stuck state is entered, and the NAND gate provides a logic 0. This can only happen if three requests came at the same time and before no request was pending. In that case any of the pending requests could be served.

To leave this stuck state, the v2_req signal is temporary disabled such that a grant of request v0 or v1 will ripple through. This is achieved by the AND gate A of the input stage 810. When A receives a logic 0 its output can only be 0. When the stuck state disappears the v2_req signal is re-entered back into the queue. The overall order is irrelevant as the stuck state can only occur if all three requests arrive at the same time. It will be appreciated that the first feedback loop 830 may be implemented using different logic circuitry.

During a transition from one granted request to the next, it might happen that there is overlap depending on internal delays and different cell sizes. The second feedback loop 840 is used to prevent an overlap between two granted requests and therefore enable systematic mutual exclusivity of the granted signals.

Each NOR gate $N^0$, $N^1$, $N^2$ provides a feedback signal to a corresponding AND gate $A^0$, $A^1$, $A^2$, respectively. As a result, any signal grant can only occur when the other grants have been lowered. For instance $N^0$ receives v1_granted and v2_granted and provides a first feedback signal to $A^0$. If the signals v1_granted and v2_granted are both low (logic 0) then the first feedback is high (logic 1). If at least one of the v1_granted signal and the v2_granted signal is high (logic 1) then the first feedback is low (logic 0). Similarly $N^1$ receives v0_granted and v2_granted and provides a second feedback signal to $A^1$. The NOR gate $N^2$ receives v0_granted and v1_granted and provides a third feedback signal to $A^2$. It will be appreciated that the second feedback loop 840 may be implemented using different logic circuitry.

Figure 9:
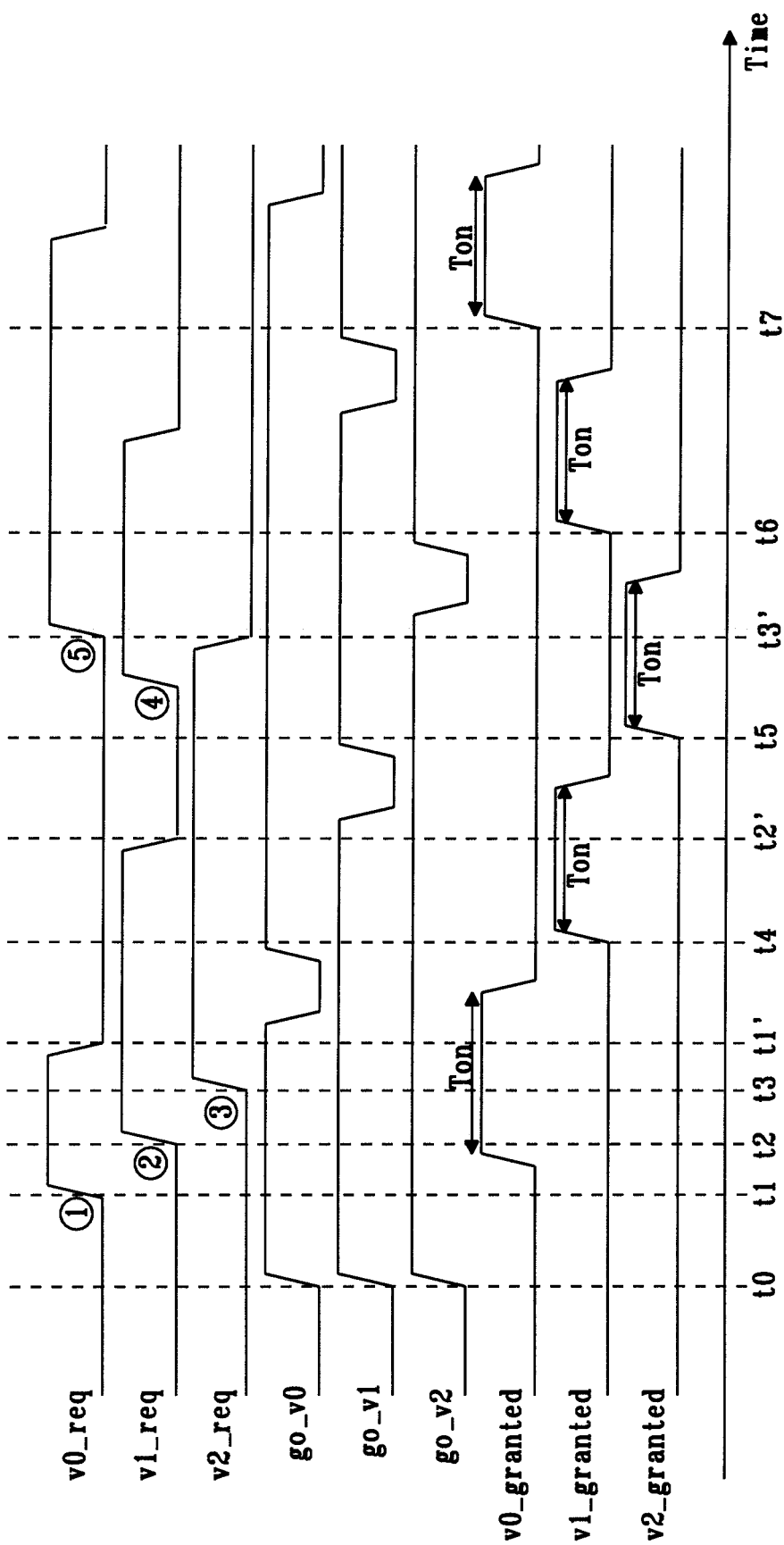
FIG. 9 is a timing diagram illustrating the operation of the arbiter of FIG. 8.

FIG. 9 is a timing diagram illustrating the operation of the arbiter 800 of FIG. 8. The request signals are provided in a specific sequential order v0, v1, v2, v1, v0 as illustrated by the labels 1-5 showing the rising edge of each request signal.

At an initial time t0, the go signals go_v0, go_v1, and go_v2 rise from logic 0 to logic 1. At time t1, the v0_req signal goes high, $M^1$ serves v0_req and $M^2$ serves v0_req. At time t1' the v0_req is low and shortly after the go_v0 signal goes low, hence clearing the filter cell $W^1$ and lowering one input request of the MUTEX cells $M^1$ and $M^2$. Similarly the go_v1 signal goes low after time t2' once v1_req has been served, hence clearing the filter cell $W^2$ and lowering one input request of the MUTEX cells $M^1$ and $M^3$. The go_v2 signal goes low after time t3' once v2_req has been served, hence clearing the filter cell $W^3$ and lowering one input request of the MUTEX cells $M^2$ and $M^3$.

It will be appreciated that the arbiter will also operate when v0_req is not lowered. In this scenario the v0_req will be set back in the queue without disrupting any pending requests.

The signals v0_granted, v1_granted and v2_granted are provided in the same order as the request signals. The signal v0_granted goes high between the times t1 and t2 and stays on for a duration Ton. Then the signal v1_granted goes high at time t4 and stays on for a duration Ton. Then the signal v2_granted goes high at time t5 and stays on for a duration Ton. Then the signal v1_granted goes high again at time t6 and stays on for a duration Ton. Then signal v0_granted goes high again at time t7 and stays on for a duration Ton.

The Ton duration may be the same for each output signal or may vary for different output signals. In general the request signal goes low before the go signal goes low. However this is not an absolute requirement and the go signal may go low while the corresponding request signal remains high.

As a result, the v2_granted signal is no longer starved and new requests are always placed back in line. In addition, the arbiter of the disclosure ensures that the $4^{th}$ and $5^{th}$ requests are keeping the correct order while being queued as the $3^{rd}$ request has not finished yet.

The arbiter of FIG. 8 is designed with three inputs and three MUTEX cells for managing three request signals, however it will be appreciated that the design of FIG. 8 could be modified to work with more request signals. For instance, an arbiter with four inputs would require six MUTEX cells, and an arbiter with five inputs would require ten MUTEX cells. More generally the number of MUTEX cells x will scale with the number of request signals n according to the formula:

$x=n(n-1)/2$.

Figure 10:
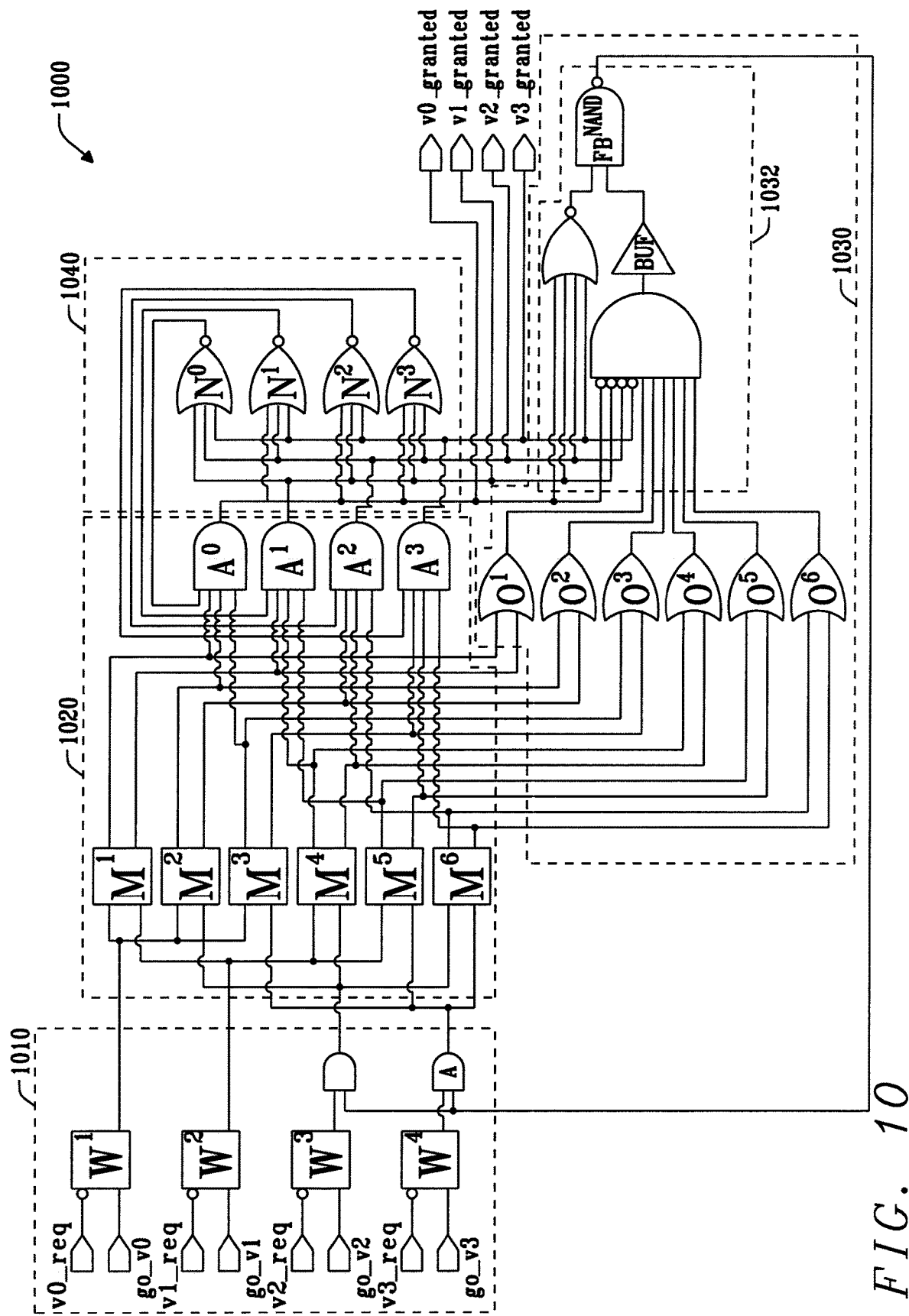
FIG. 10 is another exemplary implementation of the arbiter of FIG. 7.

FIG. 10 illustrates a modified version of the arbiter of FIG. 8 adapted to receive and manage four request signals.

The arbiter 1000 has an input stage 1010, a sequence identifier 1020, a first feedback loop 1030 and a second feedback loop 1040.

The input stage 1010 has four filter cells $W^1$, $W^2$, $W^3$, $W^4$ and two AND gates provided at the output of $W^3$ and $W^4$. The output of each filter cell is received by three Mutex cells. For instance, the output of $W^1$ is received by $M^1$, $M^2$ and $M^3$.

The sequence identifier 1020 has six MUTEX cells $M^1$-$M^6$ and four 4-inputs AND gates $A^0$-$A^3$. Each AND gate receives the output of three MUTEX cells and a feedback signal from the second feedback loop 1040. For instance, $A^0$ receives the first output of $M^1$, $M^2$ and $M^3$ as well as the feedback signal from $N^0$.

The first feedback loop 1030 has six OR gates $O^1$-$O^6$ coupled to the timing circuit 1032. The second feedback loop 1040 has four NOR gates $N^0$-$N^3$.

Although the number of digital elements has changed the general principle of operation remains similar as described with respect to FIG. 8. A difference is that the stuck state can already occur when 3 out of 4 requests occur simultaneous. Therefore, disabling one of the requests is not sufficient. Instead, two requests are temporary disabled. This does not break the order as the stuck state can only occur when 3 or 4 requests occur at the same time so there is no order to preserve. The temporary disable signal is removed after the circuit selects either v0 or v1. It is guaranteed that either signal is set as the stuck state can only occur with three or four simultaneous requests.

The arbiter of the disclosure could be used as part of various electronic systems, including asynchronous controllers. The arbiter circuit of the disclosure is also particularly useful in applications in which the order of request should be preserved.

Figure 11:
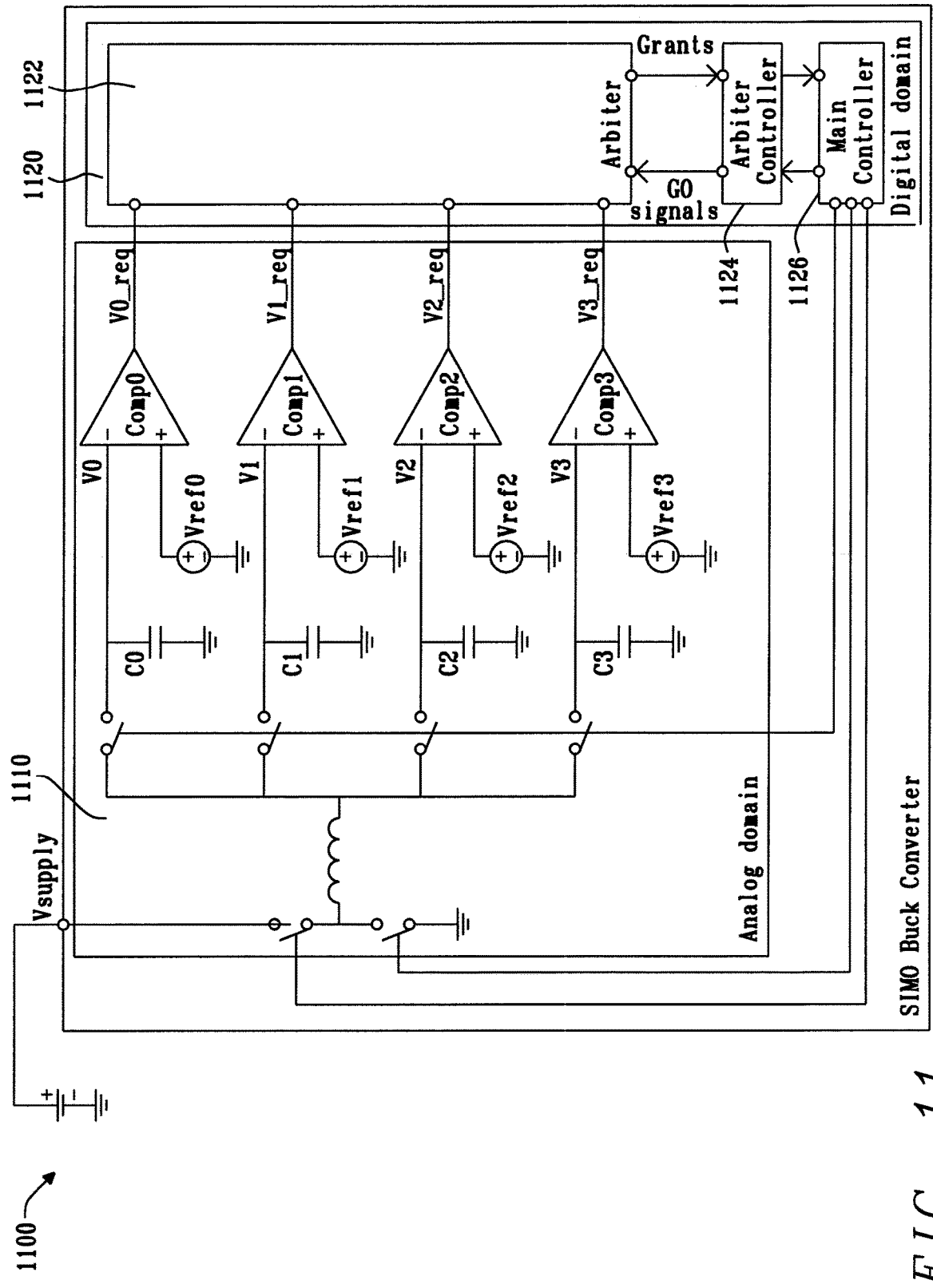
FIG. 11 is a diagram of a power management circuit including the arbiter of the disclosure.

FIG. 11 is a diagram of a power management circuit. The power management circuit 1100 has an analog domain 1110 that includes a switching converter, in this example a Single Inductor Multiple Output (SIMO) Buck converter, and a digital domain 1120 that includes a controller for controlling the multiple output voltages of the SIMO Buck. The digital controller includes an arbiter 1122, an arbiter controller 1124 and a main controller 1126. The arbiter 1122 is implemented as described above with reference to FIGS. 7, 8, 9 and 10.

Each output of the Buck converter is provided with a comparator for comparing the output voltage with a reference value, and to output a request signal. In this example the Buck converter has four outputs for providing the output voltages v0, v1, v2 and v3, and four comparators Comp0, Comp1, Comp2 and Comp3 for generating the request signals v0_req, v1_req, v2_req and v3_req respectively.

In operation, when the system is ready the arbiter controller 1124 generates and send the go signals to the input stage of the arbiter 1122. The arbiter controller also receives the grant signals from the arbiter 1122 as a feedback. If the voltage v0 is below a reference value, then the comparator Comp0 may provide the request signal v0_req as a high logic signal. Then the main controller 1126 controls the operation of the buck converter to increase the voltage v0. When the output voltage v0 is back to a level above the reference value, the arbiter controller lowers the corresponding go signal. The same control operation applies for the channels v1, v2 and v3.

The arbiter of the disclosure is advantageous for arbitration during high loads. In situations in which the number of requests exceeds the capacity of the converter, it is important to preserve the order of request. This permits to distribute the requests consistently, and not just to a few requests while excluding others. If priority is always given to the same request, for instance the first request, then the system may fail or starve. The arbiter of the disclosure permits to serve each request in the same order of incoming requests, hence preserving the operation of the whole system. In addition, the arbiter can operate even when multiple requests arrive at sensibly the same time or within a short time window, hence preventing the system being stuck in a deadlock or forbidden state.

A skilled person will appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

What is claimed is:

1. An arbiter for use with three or more request signals, wherein each request signal is generated by a separate request signal generator; the arbiter comprising
   a sequence identifier adapted to identify an order between the three or more request signals; wherein the sequence identifier comprises three or more memory cells arranged in parallel, each memory cell being configured to identify and store an order between two requests among the three or more request signals;
   the arbiter being adapted to provide three or more output signals each output signal being associated with a request signal among the three or more request signals,
   wherein when the three or more request signals are provided in a sequential order the three or more output signals are provided in the identified sequential order, and when the three or more request signals are provided substantially at the same time the three or more output signals are provided in an arbitrary sequential order.

2. The arbiter as claimed in claim 1, comprising an input stage to receive the three or more request signals, wherein the input stage comprises three or more filter cells to filter the three or more request signals.

3. The arbiter as claimed in claim 2, wherein each filter cell is adapted to receive a dedicated lock signal to lock the filter cell for a required duration.

4. The arbiter as claimed in claim 2, wherein the input stage comprises an AND gate coupled to the output of a filter cell.

5. The arbiter as claimed in claim 1, wherein each memory cell is adapted to receive two input logic signals and hold one of the signals high and the other low based on their order of arrival.

6. The arbiter as claimed in claim 1, wherein the three or more memory cells comprise three or more mutual exclusion cells.

7. The arbiter as claimed in claim 1, wherein each memory cell is coupled to two different filter cells to receive two different filtered request signals.

8. The arbiter as claimed in claim 1, wherein the sequence identifier comprises a logic circuit coupled to the three or more memory cells to identify the sequential order.

9. The arbiter as claimed in claim 8, wherein the logic circuit comprises a plurality of AND gates, each AND gate being coupled to the outputs of at least two memory cells for receiving logic signals associated with a same request.

10. The arbiter as claimed in claim 8, further comprising a second feedback loop adapted to prevent an overlap between one or more output signals.

11. The arbiter as claimed in claim 10, wherein the second feedback loop comprises a plurality of NOR gates, each NOR gate being coupled to the logic circuit of the sequence identifier.

12. The arbiter as claimed in claim 1, further comprising a forbidden state circuit adapted to identify the occurrence of a forbidden state, and upon identification to arbitrarily select a pending request signal to provide a corresponding output signal.

13. The arbiter as claimed in claim 12, wherein the forbidden state circuit is adapted to disable momentarily at least one request signal upon identifying the occurrence of the forbidden state.

14. The arbiter as claimed in claim 12, wherein the forbidden state is a state in which several request signals arrive at substantially the same time.

15. The arbiter as claimed in claim 12, wherein the forbidden state circuit includes a first feedback loop comprising a plurality of OR gates coupled to a timing circuit, the timing circuit being adapted to prevent a false detection of a forbidden state.

16. The arbiter as claimed in claim 15, wherein each OR gate is coupled to a corresponding memory cell of the sequence identifier, and wherein the output of the timing circuit is coupled to an input stage to receive the three or more request signals.

17. The arbiter as claimed in claim 15, wherein the timing circuit comprises a NAND gate having a first input coupled to a first path, and a second input coupled to a second path, wherein the first path comprises a NOR gate adapted to receive the output signals, and wherein the second path comprises an AND gate adapted to receive the outputs of the OR gates and the inverted output signals.

18. A signal arbitration method comprising the steps of
receiving three or more request signals, wherein each request signal is generated by a separate request signal generator;
identifying an order between the three or more request signals using a sequence identifier; wherein the sequence identifier comprises three or more memory cells arranged in parallel, each memory cell being configured to identify and store an order between two requests among the three or more request signals;
providing three or more output signals each output signal being associated with a request signal among the three or more request signals,
wherein when the three or more request signals are provided in a sequential order the three or more output signals are provided in the identified sequential order, and when the three or more request signals are provided substantially at the same time the three or more output signals are provided in an arbitrary sequential order.

19. An electronic circuit comprising an arbiter, wherein the arbiter comprises
a sequence identifier adapted to identify an order between three or more request signals, wherein each request signal is generated by a separate request signal generator; wherein the sequence identifier comprises three or more memory cells arranged in parallel, each memory cell being configured to identify and store an order between two requests among the three or more request signals;
the arbiter being adapted to provide three or more output signals each output signal being associated with a request signal among the three or more request signals,
wherein when the three or more request signals are provided in a sequential order the three or more output signals are provided in the identified sequential order, and when the three or more request signals are provided substantially at the same time the three or more output signals are provided in an arbitrary sequential order.

20. The electronic circuit as claimed in claim 19, the electronic circuit further comprising an arbiter controller, the arbiter controller being adapted to generate a plurality of lock signals, each lock signal being associated with a corresponding filter cell of the arbiter.

21. The electronic circuit as claimed in claim 20 further comprising a switching converter coupled to the arbiter, the switching converter being adapted to provide the three or more request signals.

* * * * *